(12) United States Patent
Shaked et al.

(10) Patent No.: US 10,403,471 B2
(45) Date of Patent: Sep. 3, 2019

(54) SYSTEMS AND METHODS FOR CHARGED PARTICLE BEAM MODULATION

(71) Applicant: Hermes Microvision, Inc., Hsinchu (TW)

(72) Inventors: Ehud Shaked, Netanya (IL); Martinus Maassen, San Francisco, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/826,600

(22) Filed: Nov. 29, 2017

(65) Prior Publication Data

US 2019/0164721 A1     May 30, 2019

(51) Int. Cl.
*H01J 37/28* (2006.01)
*H01J 37/26* (2006.01)
*H01J 37/147* (2006.01)
*H01J 37/244* (2006.01)

(52) U.S. Cl.
CPC .......... *H01J 37/261* (2013.01); *H01J 37/147* (2013.01); *H01J 37/28* (2013.01); *H01J 37/244* (2013.01); *H01J 2237/2602* (2013.01)

(58) Field of Classification Search
CPC ........ H01J 37/261; H01J 37/147; H01J 37/28; H01J 37/244; H01J 2237/2602
USPC ............. 250/306, 307, 492.1, 492.2, 492.21, 250/492.22, 492.3
See application file for complete search history.

(56) References Cited

U.S. PATENT DOCUMENTS

2005/0285541 A1* 12/2005 LeChevalier ............. H01J 3/36
315/169.3

* cited by examiner

*Primary Examiner* — Nicole M Ippolito
(74) *Attorney, Agent, or Firm* — Finnegan, Henderson, Farabow, Garrett & Dunner, LLP

(57) ABSTRACT

Systems and methods for conducting charged particle beam modulation are disclosed. According to certain embodiments, a charged particle beam apparatus generates a plurality of charged particle beams. A modulator may be configured to receive the plurality of charged particle beams and generate a plurality of modulated charged particle beams. A detector may be configured to receive the plurality of modulated charged particle beams.

21 Claims, 18 Drawing Sheets

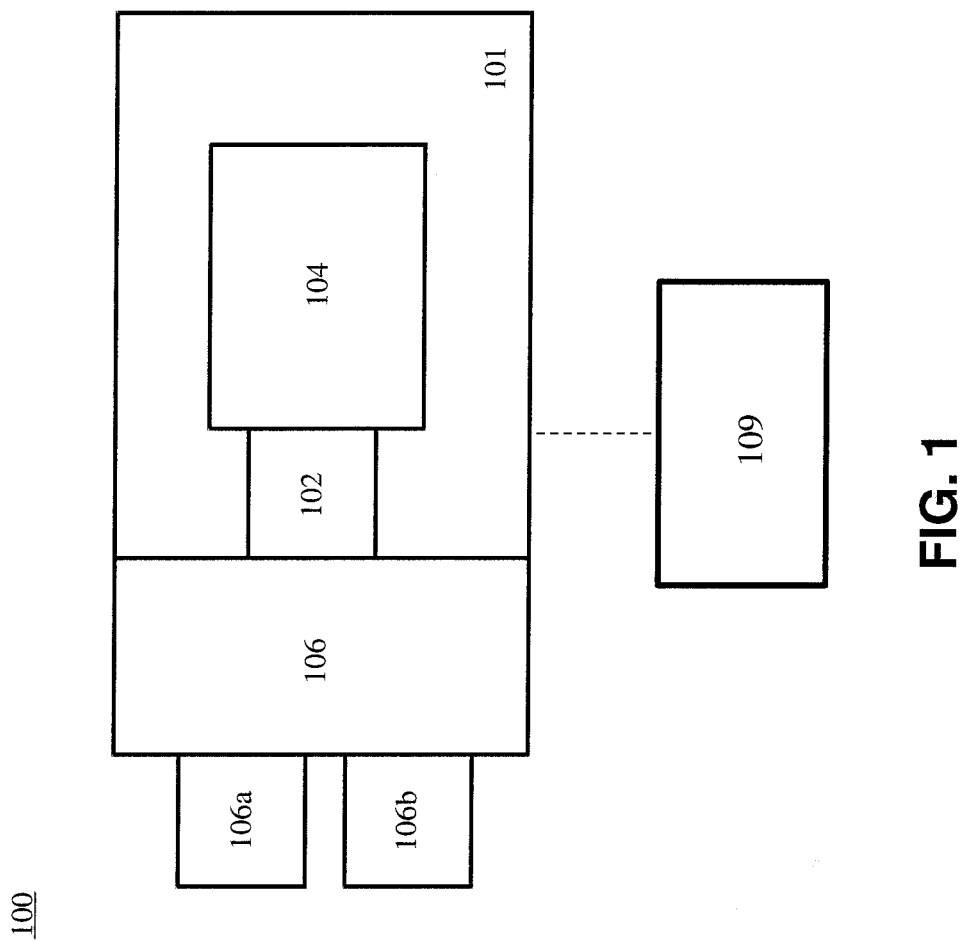

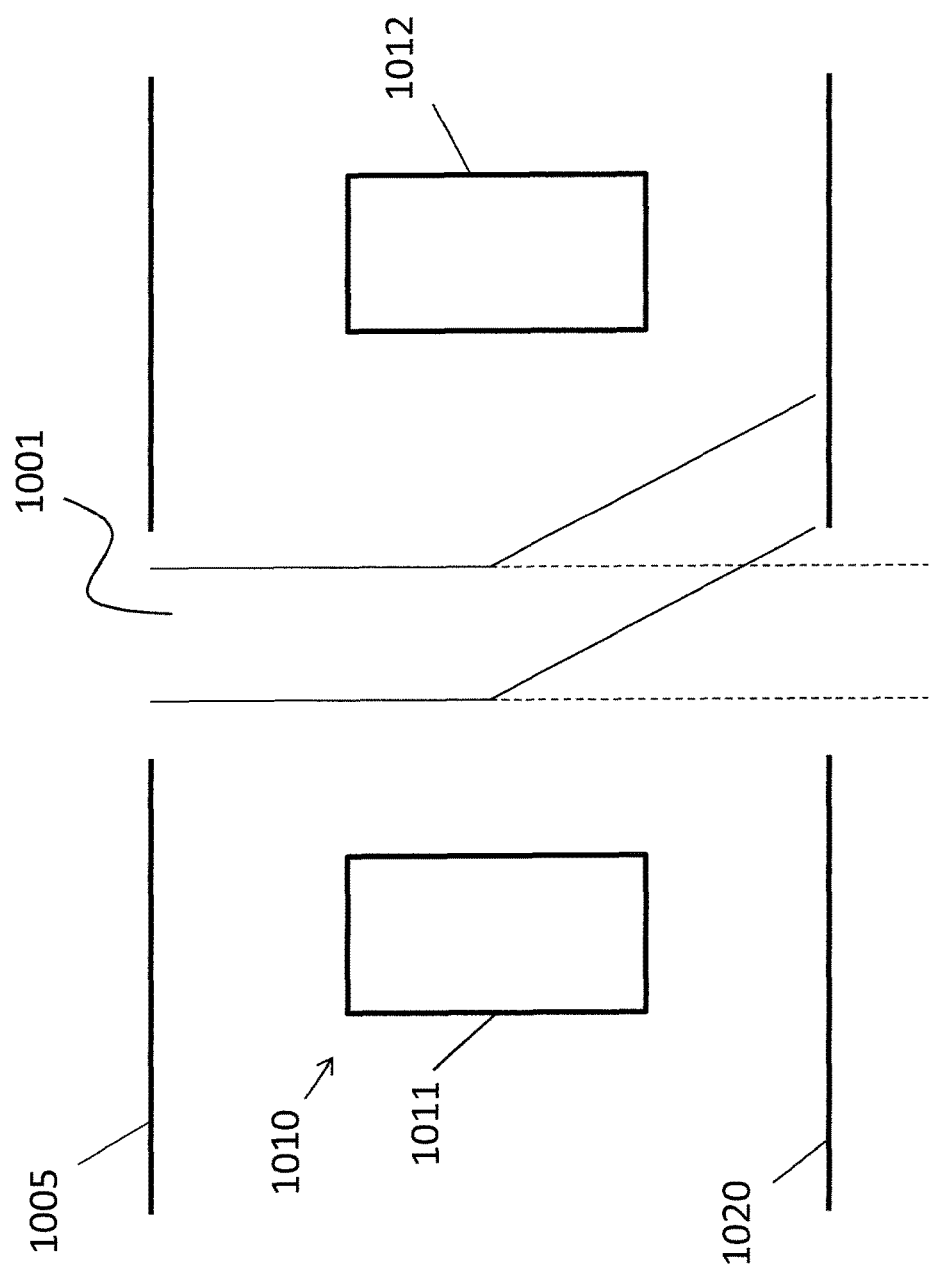

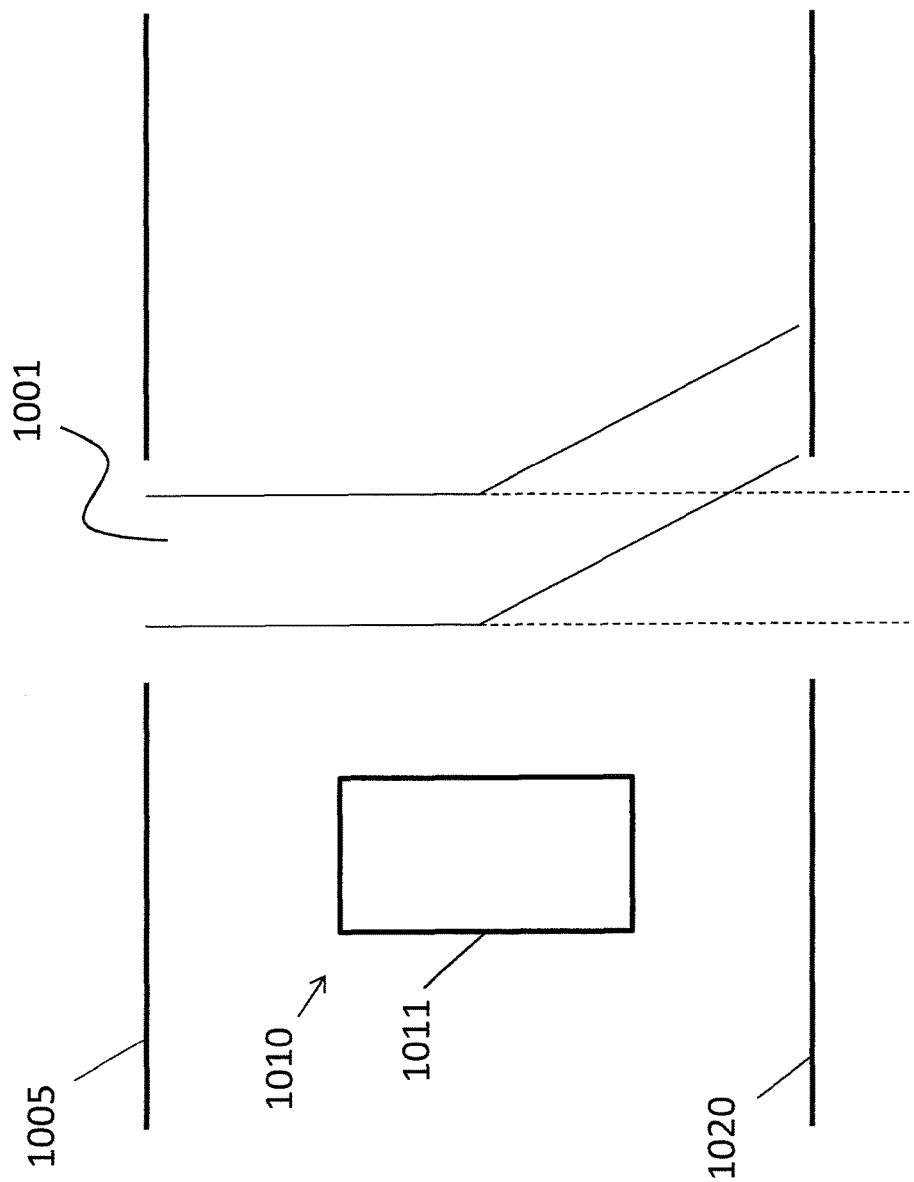

SYSTEMS AND METHODS FOR CHARGED PARTICLE BEAM MODULATION

TECHNICAL FIELD

The present disclosure generally relates to the field of charged particle beam systems, and more particularly, to systems and methods for modulating a charged particle beam.

BACKGROUND

Charged particle beam systems are employed in various fields, such as electron microscopy, lithography, particle acceleration, and others. As one example, electron microscopes are useful tools for observing the surface topography and composition of a sample. In an electron beam tool used for microscopy, electrons are directed to a sample and may interact with the sample in various ways. For example, when an electron beam impinges on a sample, secondary electrons, backscattered electrons, auger electrons, x-rays, visible light, etc. may be scattered from the sample and directed to a detector. Scattered particles may form one or more beams incident on the detector.

To increase throughput, a multi-beam imaging (MBI) system may split a primary electron beam into a plurality of beamlets for scanning multiple separate areas of a sample simultaneously. After impinging on the sample, a plurality of beamlets of scattered or secondary electrons may be directed onto a detector. Typically, a detector for use in an MBI system may be provided with a plurality of sensing elements, for example, in the form of a pixelated array. Due to the effects of aberration and dispersion, multiple beam spots may overlap on the detector surface, leading to crosstalk. Furthermore, the beam spots may drift and change the locations at which detector sensing elements are activated for sensing the beam spot. Additional optical elements may be required to track the multiple beam spots and correct the projection of the beamlets, contributing to complexity and adding difficulties to scaling up detector systems. Additionally, when a fine detector array comprising a large number of sensing elements is provided, a switching matrix should also be provided to connect individual sensing elements associated with the same beam spot, introducing further complexity.

SUMMARY

Embodiments of the present disclosure provide systems and methods for charged particle beam modulation. In some embodiments, a charged particle beam system is provided. The charged particle beam system may include a charged particle beam apparatus configured to generate a charged particle beam.

In some embodiments, a charged particle source of a charged particle beam system is configured to generate a plurality of charged particle beams. A modulator may be provided that is configured to receive the plurality of charged particle beams and generate a plurality of modulated charged particle beams. Furthermore, a detector may be provided that is configured to receive the plurality of modulated charged particle beams. The detector may include a detector array of one or more sensing elements.

According to some embodiments, an arrangement can be achieved that can enhance and simplify a detection branch of a charged particle beam system.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

FIG. 1 is a schematic diagram illustrating an exemplary electron beam inspection (EBI) system, consistent with embodiments of the present disclosure.

FIGS. 10A and 10B illustrate exemplary deflectors, consistent with embodiments of the present disclosure.

DESCRIPTION OF EMBODIMENTS

Figure 2A:
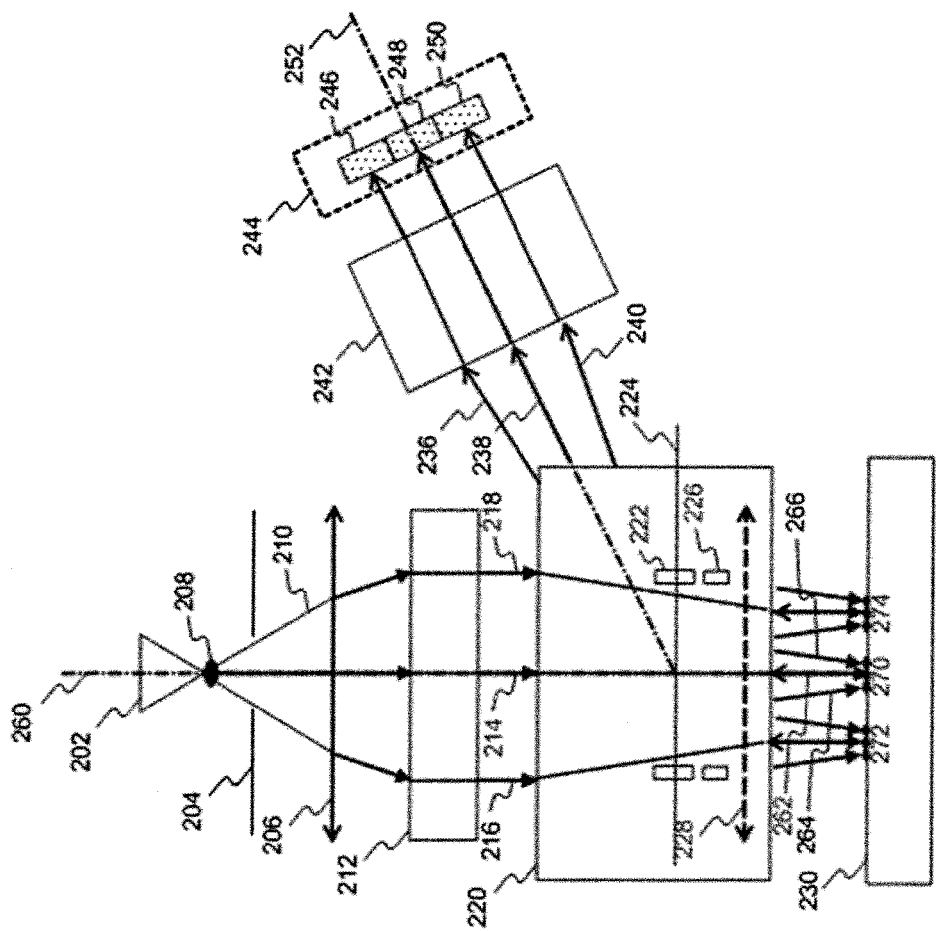
FIG. 2A is a schematic diagram illustrating an exemplary multi-beam electron beam tool, consistent with embodiments of the present disclosure that can be a part of the exemplary electron beam inspection system of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of utilizing electron beams, the disclosure is not so limited. Other types of charged particle beams can be similarly applied.

Embodiments of the present disclosure may provide a charged particle system that may be useful for charged particle imaging. The charged particle system may be applicable as a scanning electron microscope (SEM) tool for imaging and inspecting a sample.

In some exemplary embodiments, modulation is applied to a charged particle beam. A modulator may modulate a plurality of beamlets of an MBI system. In some embodiments, a modulator may modulate a plurality of beams generated from a single primary electron beam. As used herein, the phrases "a plurality of beams" or "a plurality of charged particle beams" may refer to a plurality of beamlets or one or more other beams.

Modulation is used in data processing and communications applications to multiplex a signal of digital data for transmitting over one or more transmission channels. For example, code-division multiple access (CDMA) is a type of multiplexing that allows various signals to occupy a single transmission channel. Generally, CDMA techniques involve spread spectrum multiple-access methods where bandwidth is spread uniformly for the same transmitted power. A spreading code may be provided that is a pseudo-random code (PN code) used for differentiating signals associated with different users. Individual signals can be extracted from the main data signal based on a correlation of received signals with locally generated code.

In an analogous manner, modulation may be applied to a charged particle beam to divide the beam into a plurality of modulated beam portions.

Modulation involves a tradeoff between the number of individual signals and bandwidth in the frequency domain. For example, two signals can be transmitted at 50 MHz, or one signal can be transmitted at 100 MHz based on the same information content. Thus, in a communications setting, a very high density of users can be accommodated on a single signal carrier line, but bandwidth allocated to each user dwindles.

In a similar manner, an MBI system may involve a large number of beamlets that may each represent a unique subset of topography information. An MBI system may divide a primary charged particle beam into a plurality of beamlets. A large number of beamlets may interact with a sample and be directed onto a detector. At the detector, the deflected beamlets may simultaneously irradiate the detector surface at different locations. An area detector can be provided with a plurality of sensing elements that receives and transmits signals assigned to each beamlet. Furthermore, because the shape and/or position of a beamlet may not necessarily exactly correspond to a sensing element, the detector may be broken up into a fine array including a large number of small sensing elements. For example, a single beamlet may be sensed by multiple sensing elements, each of which may not fully encompass the beamlet. Manipulation of the connections between sensing elements can enable the outputs of corresponding beamlets to be collected together. That is, outputs of a plurality of sensing elements may be summed to obtain a corresponding output of one beamlet.

Thus, a detector with a large number of sensing elements may be required to receive energy from all of the beamlets while being able to adjust for deviations in the shape and location of the beamlets. A large number of sensing elements may be necessary in order to ensure spatially separation among the beamlets and prevent crosstalk. For example, an area detector array of 21×21 sensing elements may comprise 21×21 channels to transmit signals. Each channel may have a sampling rate of 100 MHz and bandwidth of 33 MHz.

In some embodiments, modulation can be applied to the beamlets to reduce the number of signals. According to some embodiments, modulation may be useful in enhancing and/or simplifying detector systems.

Reference is now made to FIG. 1, which illustrates an exemplary electron beam inspection (EBI) system 100 consistent with embodiments of the present disclosure. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFhM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" hereafter).

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 3:
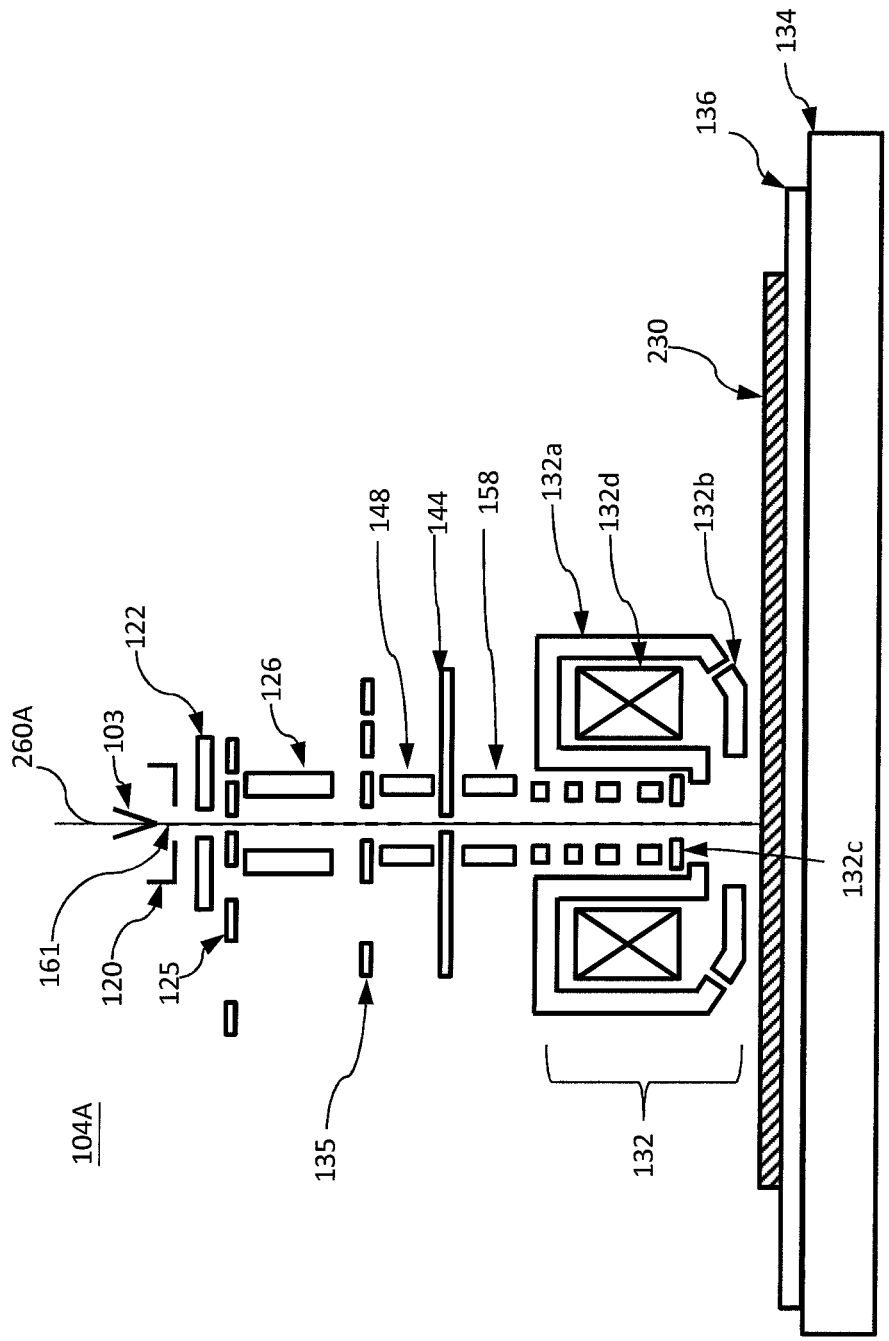
FIG. 3 is a schematic diagram illustrating an exemplary single-beam electron beam tool, consistent with embodiments of the present disclosure that can be a part of the exemplary element beam inspection system of FIG. 1.

FIG. 2A illustrates an electron beam tool 104 that may be configured for use in EBI system 100. Electron beam tool 104 may be a multi-beam apparatus, as shown in FIG. 2A, or a single beam apparatus, as shown in FIG. 3.

FIG. 2A illustrates an electron beam tool 104 (also referred to herein as apparatus 104) that may be configured for use in a multi-beam imaging (MBI) system. Electron beam tool 104 comprises an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2A), multiple secondary electron beams 236, 238, and 240, a secondary optical system 242, and an electron detection device 244. Primary projection optical system 220 can comprise a beam separator 222, deflection scanning unit 226, and objective lens 228. Electron detection device 244 can comprise detection sub-regions 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and electron detection device 244 can be aligned with a secondary optical axis 252 of apparatus 104.

Electron source 202 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 can block off peripheral electrons of primary electron beam 210 to reduce Coulomb effect. The Coulomb effect may cause an increase in size of probe spots.

Source conversion unit 212 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit the plurality of beamlets 214, 216, and 218. While three beamlets 214, 216, and 218 are shown in FIG. 2A, embodiments of the present disclosure are not so limited. For example, in some embodiments, an apparatus 104 may be configured to generate a first number of beamlets. In some embodiments, the first number of beamlets may be in a range from 1 to 1000. In some embodiments, the first number of beamlets may be in a range from 200-500. In an exemplary embodiment, an apparatus 104 may generate 400 beamlets.

Figure 2B:
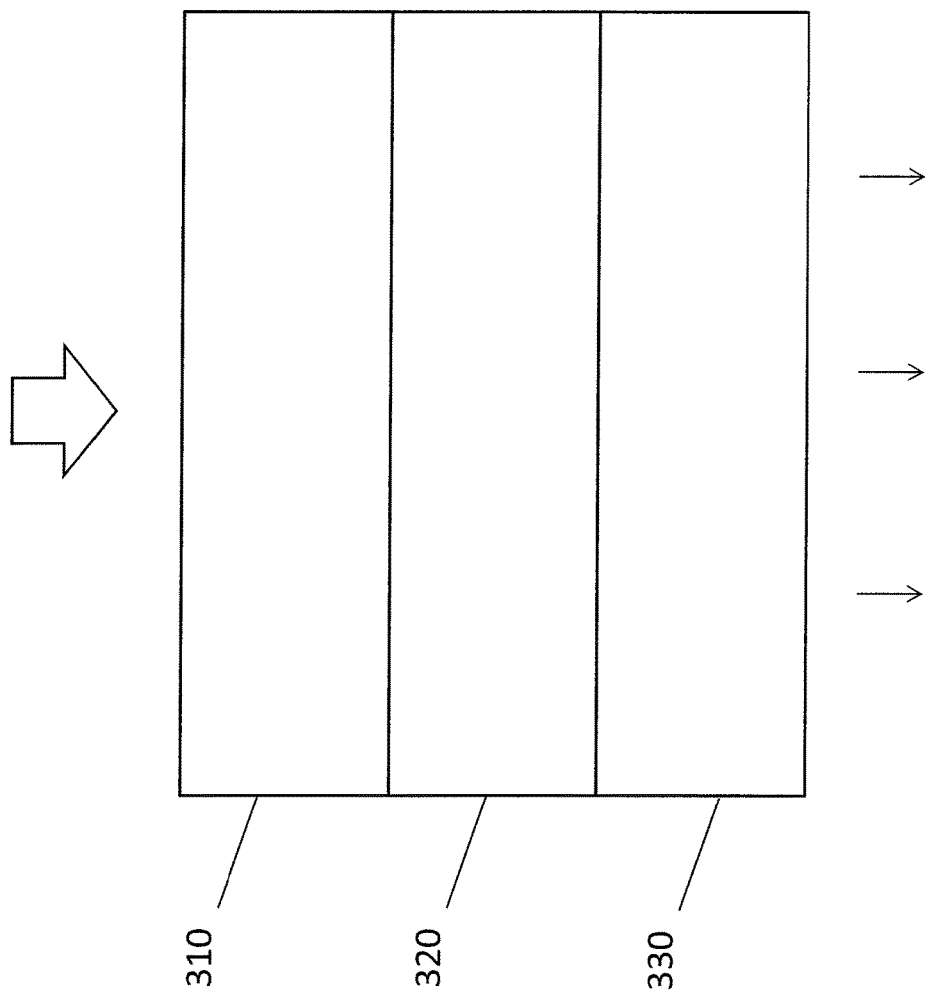
FIG. 2B is a diagram illustrating a source conversion unit, consistent with embodiments of the present disclosure.

An example of source conversion unit 212 is shown in FIG. 2B. Source conversion unit 212 may comprise one or more micro electro-mechanical system (MEMS) structures. For example, source conversion unit 212 may comprise an optional pre-bending deflector array (PBDA) module 310, one or more spacer substrates 320, and a micro deflector compensator array (MDCA) module 330. A primary charged particle beam may be input to source conversion unit 212 and a plurality of beamlets may be output.

Structures included in PBDA module 310 may comprise a plurality of substrates including apertures, deflectors, and electrodes, among other structures. The substrates may be arranged in a stacked arrangement. Similarly, structures included in MDCA module 330 may comprise a plurality of substrates including apertures, deflectors, electromagnetic lenses, and electrodes, among other structures.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for imaging, and can form a plurality of probe spots 270, 272, and 274 on surface of wafer 230.

Beam separator 222 can be a beam separator of Wien filter type generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can also be non-zero. Beam separator 222 can separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 can comprise electrons with a distribution of energies including secondary electrons (energies≤50 eV) and back-scattered electrons (energies between 50 eV and landing energies of beamlets 214, 216, and 218). Secondary optical system 242 can focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Next, an example of a single-beam electron beam tool will be discussed. As shown in FIG. 3, an electron beam tool 104A includes a wafer holder 136 supported by motorized stage 134 that can hold wafer 230 to be inspected. Electron beam tool 104A includes an electron emitter, which may comprise a cathode 103, an anode 120, and a gun aperture 122. Electron beam tool 104A further includes a beam limit aperture 125, a condenser lens 126, a column aperture 135, an objective lens assembly 132, and an electron detector 144. Objective lens assembly 132, in some embodiments, is a modified SORIL lens, which includes a pole piece 132a, a control electrode 132b, a deflector 132c, and an exciting coil 132d. In a general imaging process, the electron beam 161 emanating from the tip of the cathode 103 is accelerated by anode 120 voltage, passes through gun aperture 122, beam limit aperture 125, condenser lens 126, and is focused into a probe spot by the modified SORIL lens and then impinges onto the surface of wafer 230. Backscattered or secondary electrons emanated from the wafer surface are collected by detector 144 to form an image of the interest area.

A detector may be placed along an optical axis 260 of apparatus 104A, as in the embodiment shown in FIG. 3. In some embodiments, a detector may be arranged off axis.

Figure 4:
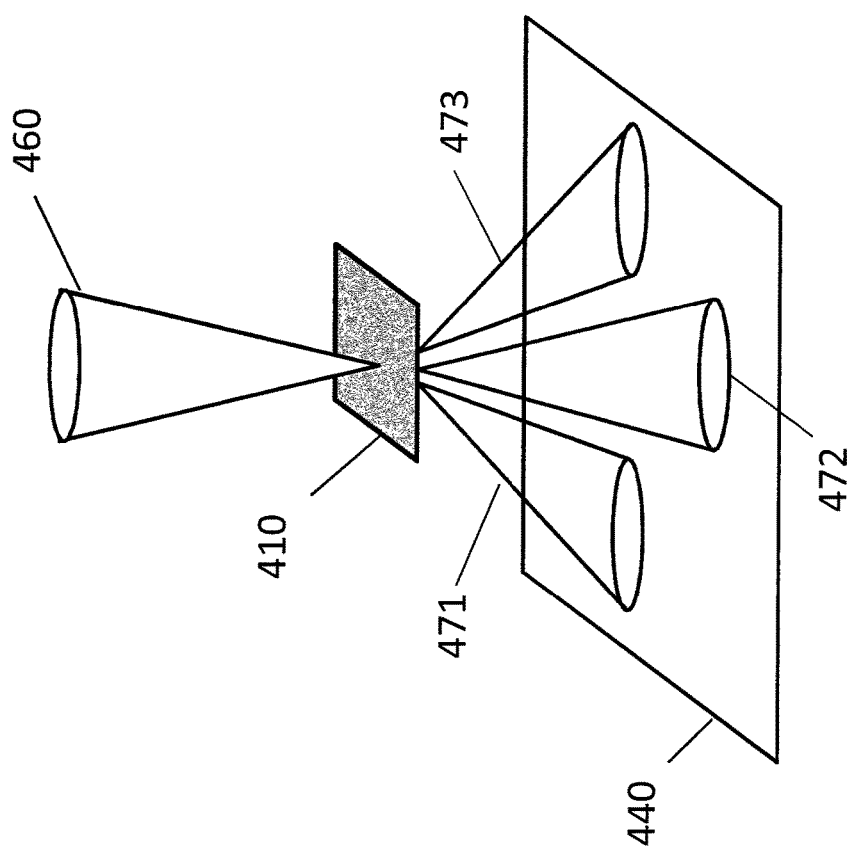
FIG. 4 is a schematic diagram illustrating exemplary transmission type electron beam tool that can be part of the exemplary electron beam inspection system of FIG. 1, consistent with embodiments of the present disclosure.

In some embodiments, other types of microscopy systems can be employed. For example, a transmission electron microscope (TEM) or a scanning transmission electron microscope (STEM), etc., can be similarly applied. In a TEM system, an electron beam may irradiate a sample with generally a higher energy than in the case of SEM, so as to allow electrons to penetrate the full depth of the sample. In TEM, a diffraction pattern may be acquired from irradiating a region of interest with a finely focused electron probe spot. FIG. 4 shows an example of a TEM system. For example, an electron beam 460 is directed to a sample 410. Electron beam 460 interacts with sample 410, and as a result, a plurality of beams 471, 472, 473 may be generated. One or more of beams 471, 472, 473 may be projected onto a detector 440.

Reference will now be made to an exemplary modulation technique.

Figure 5:
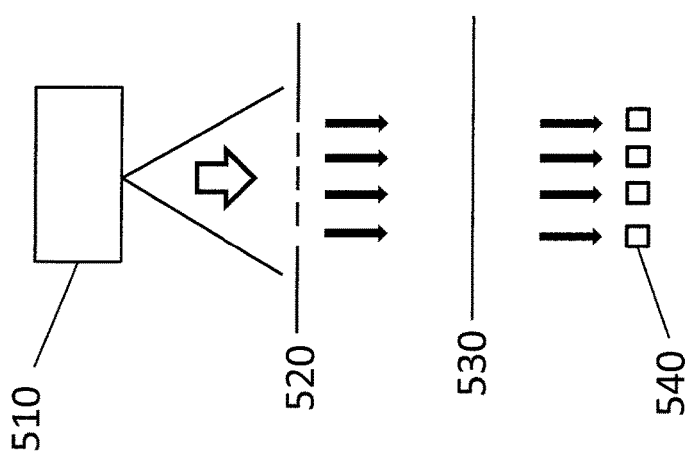
FIG. 5 is a diagram illustrating an exemplary comparative detection scheme, consistent with embodiments of the present disclosure.

In an exemplary comparative detection scheme, as shown in FIG. 5, a charged particle source 510 emits a beam. The beam passes through an aperture 520. Aperture 520 may comprise a plurality of aperture holes. Thereafter, a plurality of beamlets are generated that travel to a sample 530. After impinging on sample 530, a plurality of secondary particle beams are directed to a detector 540 comprising a plurality of sensing elements. Signals received from a number n of the plurality of sensing elements may comprise n×50 MHz signals.

Figure 6:
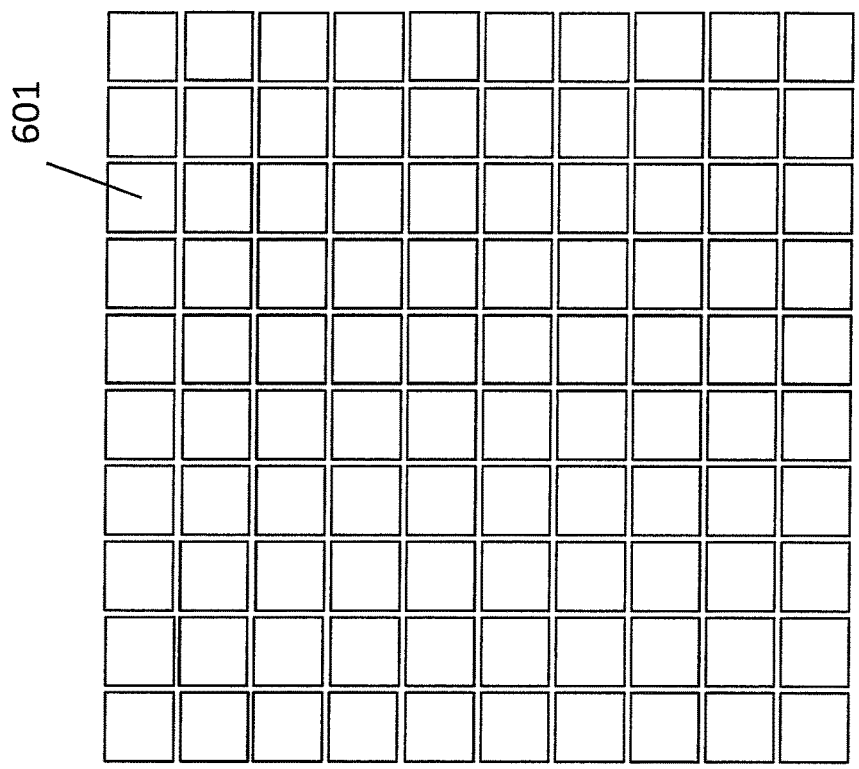
FIG. 6 is a diagram illustrating an exemplary surface of a detector, consistent with embodiments of the present disclosure.

FIG. 6 depicts an exemplary surface of detector 540. Detector 540 comprises a plurality of individual sensing elements 601 arranged in a two-dimensional array. Sensing elements 601 may be electron sensing elements that comprise, for example, a PIN diode, avalanche diode, electron multiplier tube (EMT), etc., and combinations thereof. Sensing elements 601 can generate a current signal commensurate with the amount of charged particles received on a surface thereof.

Figure 7:
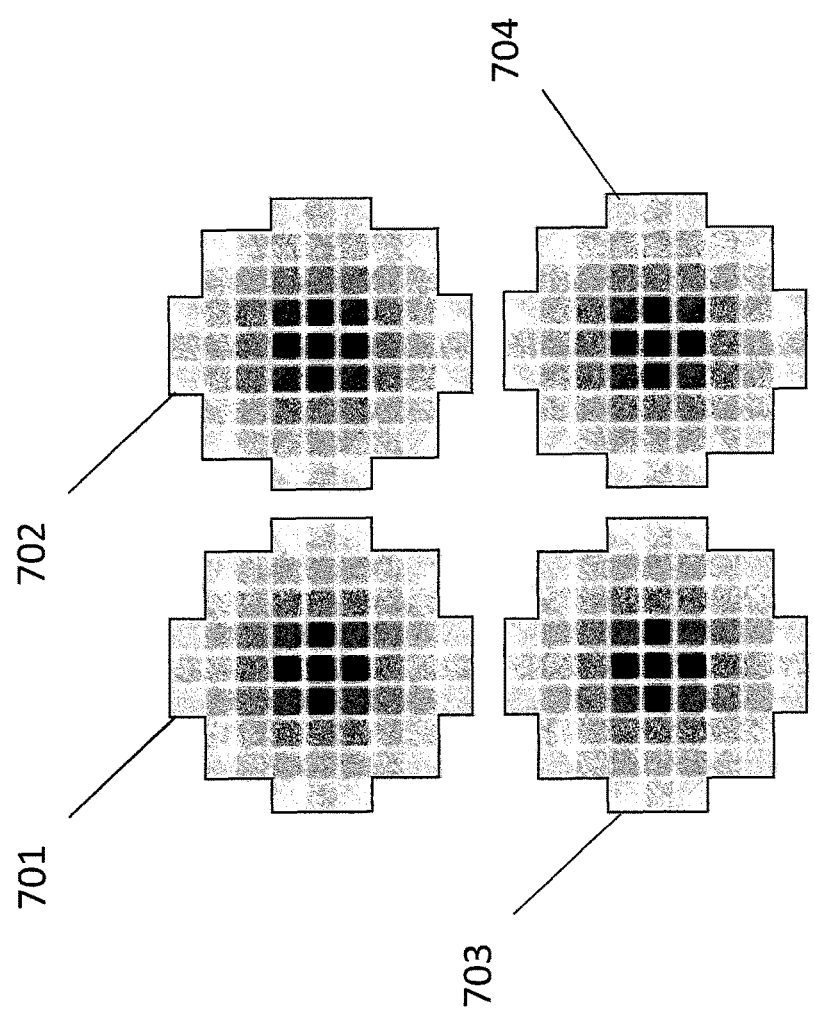
FIG. 7 is a diagram illustrating an exemplary surface of a detector, consistent with embodiments of the present disclosure.

As shown in FIG. 7, a detector array comprising a plurality of sensing elements can detect a plurality of beam spots 701, 702, 703, and 704. Furthermore, some of the individual sensing elements can be connected together so that entire beam spots are associated with a collection of sensing elements. Connections among the plurality of sensing elements may be controlled by a controller (e.g., controller 109 of FIG. 1) or one or more control circuits. The plurality of sensing elements may be configured to be connected through a switch matrix, for example.

In some embodiments, the number of sensing elements in a detector array can be reduced by employing beam modulation. Further, a detector comprising a single sensing element, e.g., a single detection plate can be used.

Figure 8:
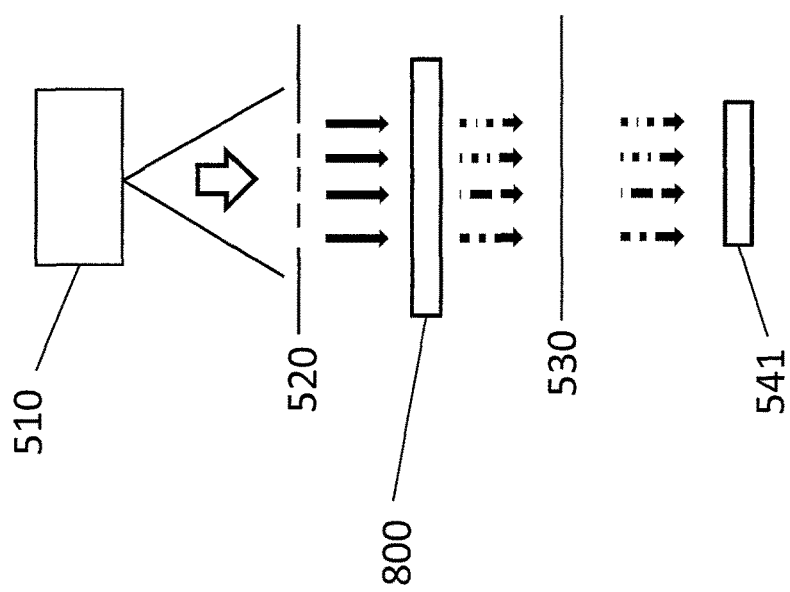
FIG. 8 is a diagram illustrating an exemplary detection scheme employing modulation, consistent with embodiments of the present disclosure.

FIG. 8 illustrates an exemplary detection scheme employing modulation. In FIG. 8, a charged particle source 510 emits a beam. The beam passes through an aperture 520. Thereafter, a plurality of beamlets are generated. A modulator 800 is also provided. Modulator 800 can receive the plurality of beamlets and output a plurality of modulated beamlets. Modulated beamlets then travel to a sample 530. After impinging on sample 530, a plurality of modulated secondary particle beamlets are directed to a detector 541. Detector 541 may include a first number of sensing elements where the first number is less than the number of the plurality of beamlets. Detector 541 may also consist of one sensing element. Because the beamlets are modulated, individual secondary beamlets may impinge on a respective sensing element of detector 541 separately. Signals received from the one or more sensing element of detector 541 may comprise one 50 MHz signal.

Modulator 800 can be located at various positions in a charged particle beam system. For example, modulator 800 can be placed between aperture 520 and sample 530, as shown in FIG. 8. In an arrangement, for example as shown in FIG. 2A, modulator 800 can be placed between source conversion unit 212 and primary projection optical system 220. Alternatively, modulator 800 can be placed between sample 530 and detector 541. In an arrangement, for example as shown in FIG. 2A, modulator 800 can be placed between secondary optical system 242 and electron detection device 244. Effects and advantages of the various arrangements will be discussed later below.

In some embodiments, modulator 800 may be integrated together with source conversion unit 212. Modulator 800 may be provided within source conversion unit 212. For example, modulator 800 may be interposed between substrates among the plurality of substrates of the various modules. Modulator 800 may be provided in substrate 320.

Figure 9:
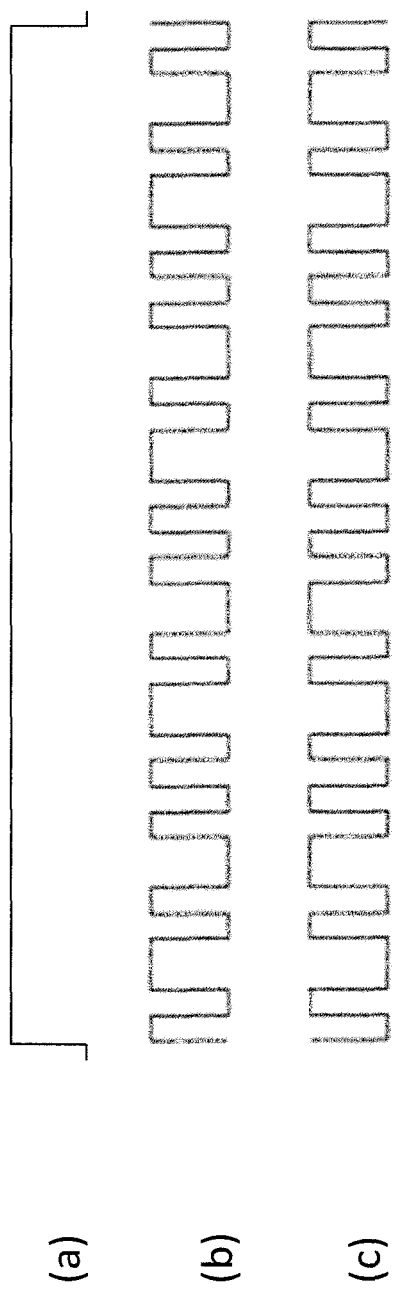
FIG. 9 is a diagram illustrating exemplary waveforms representing beam modulation, consistent with embodiments of the present disclosure.

Modulator 800 modulates the plurality of beamlets, for example, in the following manner. The plurality of beamlets can be rapidly turned on/off in a manner corresponding to a coding signal. The beamlets may be modulated according to a CDMA system configuration. With reference to FIG. 9, where the horizontal axis represents time and the vertical axis represents intensity in arbitrary units (AU), a beamlet duty cycle is shown in graph (a). As an example, a beamlet has a duty cycle of 1, that is, the beam is constantly emitting from the electron source to be scanned across the wafer for imaging. Modulator 800 may generate a coding signal that may be based on random numbers or may be optimized to maximize the amount of charged particles reaching the detector, as shall be described later. The coding signal may be based on a pseudorandom series of numbers, for example, as shown in graph (b). Accordingly, modulator 800 may output a PN code for each individual beamlet. Thus, the coding signal is determinable, and each coding signal associated with a different beamlet should have a low degree of correlation with one another so that they can be easily distinguished. The modulated signal may comprise a signal that is combined by bitwise XOR (exclusive OR) with the beamlet to be modulated, as shown in graph (c). In this example, because the beamlet originally has a constant duty cycle of 1, the modulated signal corresponds to the inverse of its assigned PN code.

Modulator 800 may be formed by various structures. In some embodiments, a modulator comprises a deflector that deflects an electron beam (or beamlet). A deflector may comprise an electrostatic deflector, a magnetic deflector, and/or an element configured for inducing beam dispersion. As shown in FIG. 10A, a deflector 1010 is arranged adjacent to an aperture 1020. Deflector 1010 may include a deflecting element 1011 and a deflecting element 1012 provided so that deflecting elements are arranged on either sides of a passing beam. As shown in FIG. 10B, deflector 1010 may also be provided so that only one deflecting element 1011 is arranged on a side of a beam. Deflector 1010 may be controlled by application of a predetermined voltage and/or current. Deflector 1010 may be a fast switching element that can be operated at high frequency, such as on the order of GHz. Thus, a drive signal can be applied to modulator 800 to operate deflector 1010. Deflector 1010 may be operable between an "on" state where a beam 1001 passes therethrough without being deflected, and an "off" state where beam 1001 is deflected. When deflector 1010 is activated, beam 1001 deviates from an optical axis direction and is directed onto a surface of aperture 1020. Therefore, beam 1001 is prevented from continuing in the optical axis direction and is effectively turned off. When deflector 1010 is deactivated, beam 1001 reverts to its original path.

Other means of manipulating a beam may comprise, for example, a shutter, switch, and the like. In addition to aperture 1020, an aperture 1005 may be provided. Aperture 1005 may permit only one beam to enter a space between aperture 1005 and aperture 1020, and thus only one beam reaches a respective element of a deflector. Modulator 800 may comprise a plurality of deflectors arranged in an array. Modulator 800 may comprise a substantially planar substrate with a plurality of deflectors arranged in a two-dimensional array.

Modulator 800 may be placed before or after sample 530. When modulator 800 is placed before sample 530, a detection system can be simplified. For example, a plurality of beamlets may be modulated before impinging on sample 530. In response to interacting with sample 530, a plurality of modulated secondary beamlets may be directed to detector 541. The modulation may result in the secondary beamlets impinging on detector 541 separately. As the secondary beamlets interact with detector 541, a detection signal commensurate with the received electrons is generated. In some embodiments, there is no overlap of signals corresponding to the different beamlets because modulation causes the beamlets to impinge on detector 541 at separate times. Thus, the need for a plurality of separate sensing elements can be eliminated, among other things.

In an exemplary comparative detection system for a MBI system, separate sensing elements of a detector array are activated by a corresponding electron beamlet falling onto a corresponding activation area. In order to avoid cross talk (the unintended activation of a neighboring sensing element), each beamlet should be well-aligned with and well-focused on an activation area. Alignment of all beamlets with respective sensing elements may require a complex optics system. As an alternative arrangement, a fine array of many separate sensing elements may be provided, and the array can be customized via a switching matrix or field programmable array system to manipulate connections among sensing elements so that collections of sensing elements correspond with respective beamlets. Such collection can also be configured to compensate for beam movement, however, may not completely eliminate cross talk. Furthermore, in either scenario, complexities are encountered due to added components and the number of signal channels.

Figure 11:
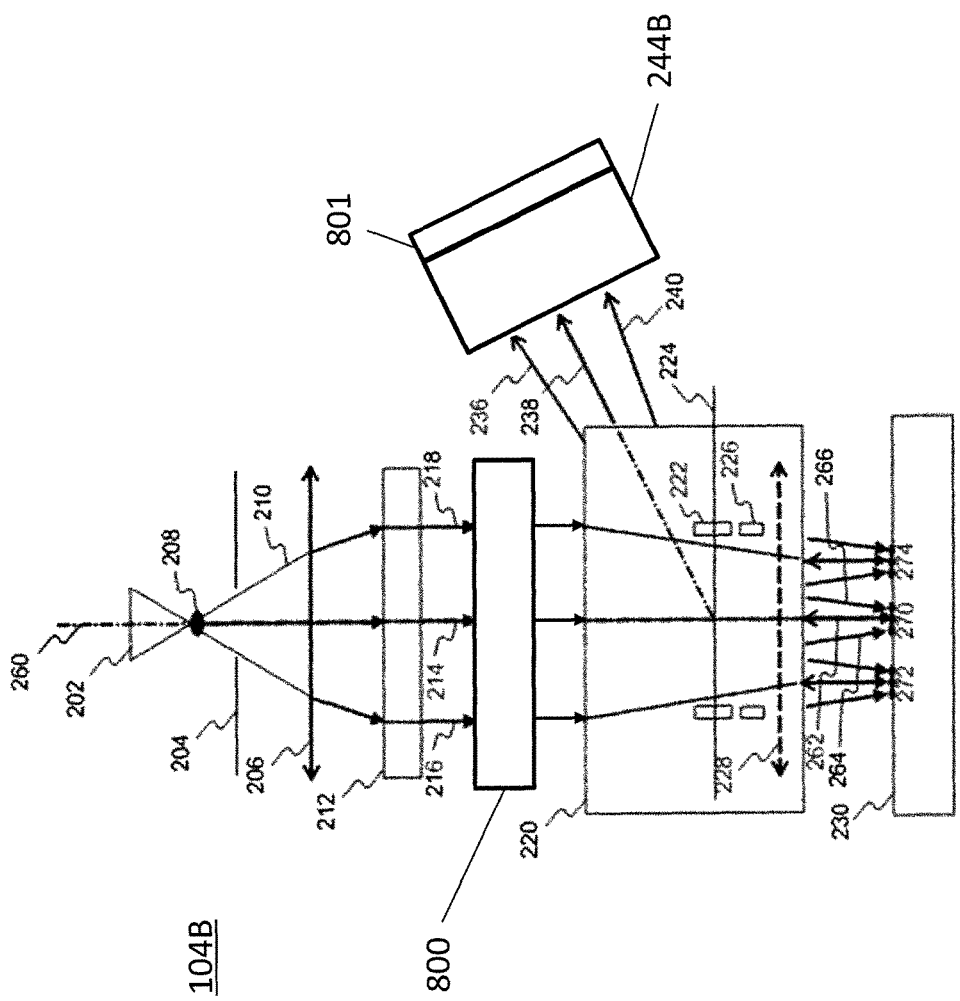
FIG. 11 is a schematic diagram illustrating an exemplary electron beam tool, consistent with embodiments of the present disclosure that can be a part of the exemplary element beam inspection system of FIG. 1.

When modulator 800 is placed before sample 530, an optical sub-system can be omitted, among other things, and a detection system can be simplified. For example, FIG. 11 illustrates an electron beam tool 104B comprising modulator 800. Modulator 800 may be configured to receive each of the beamlets generated by the electron source, for example, beamlets 214, 216, and 218. Modulator 800 may output modulated beamlets that travel to wafer 230. After interacting with wafer 230, modulated secondary beamlets 236, 238, 240 can directly impinge on detector 244B. Secondary optical system 242 can thus be omitted, since modulated secondary beamlets need not be focused and aligned with respective sensing elements. Detector 244B may comprise a single sensing element that may be configured as a detector plate. Since an entire surface area of a detector plate may constitute an active area, current signals can be generated regardless of where a beamlet lands on the detector plate.

In some embodiments, beam separator 222, which may comprise a Wien filter, can also be omitted. For example, beams may be directed to a surface of wafer 230 in a substantially straight linear path, and need not be bent by a Wien filter.

Furthermore, numerous other effects can be achieved. For example, due to a simplified structure of a detector plate, further flexibility in system design and detector placement can be achieved. The detector may be positioned closer to wafer 230, thus enhancing electron collection efficiency. The detector may be able to detect backscattered electrons in addition to secondary electrons. For example, electrons having differing energy levels may be configured to be attracted to various components held at differing potentials in an electron beam tool. A single detector plate may be used to gather a greater amount of electrons emitted from a sample, and thus, various electron signals can be analyzed by a detector.

When modulator 800 is placed before sample 530, optical subsystems can be maintained, if desired. For example, secondary optical system 242 need not be omitted, yet a detection system can be simplified, for example, by relaxing a focusing control of secondary electron beams 236, 238, and 240 directed onto a detector.

Figure 12:
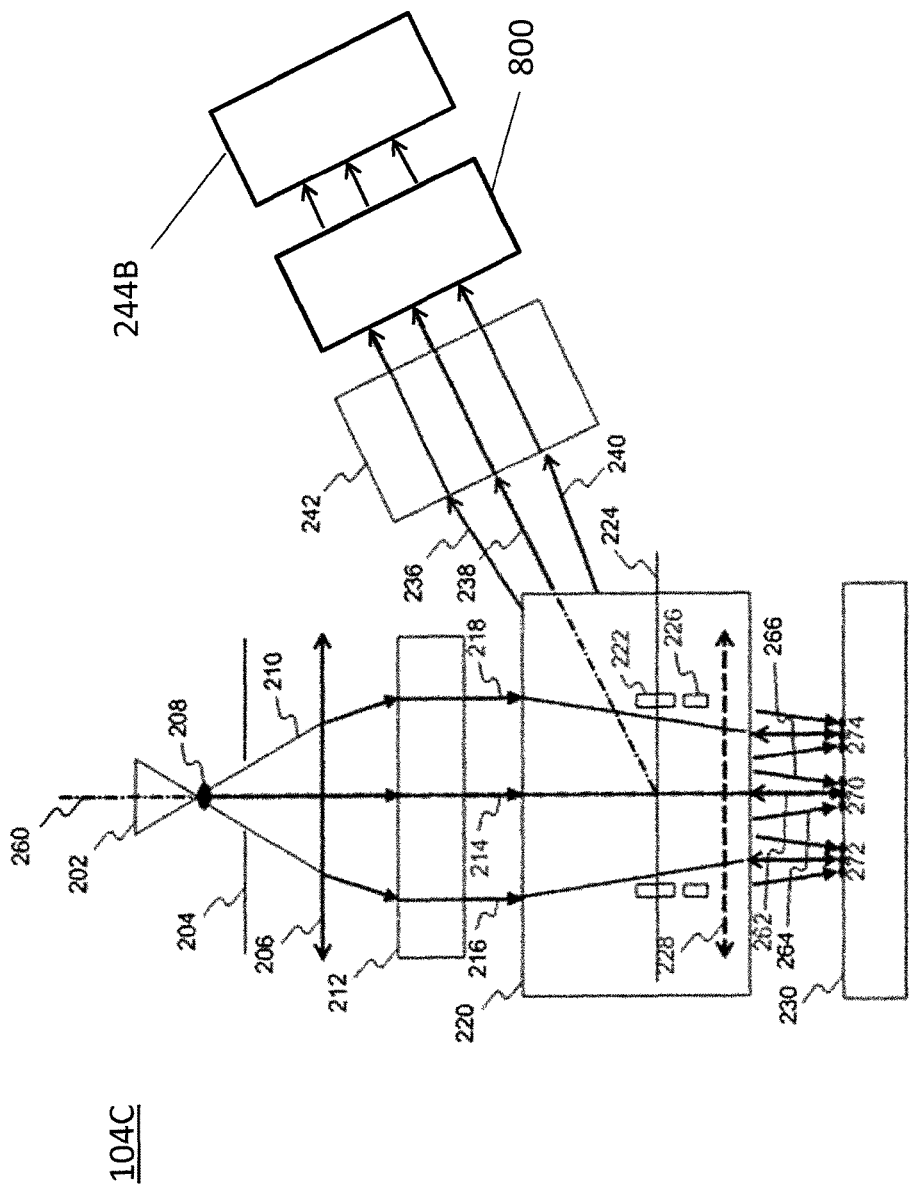
FIG. 12 is a schematic diagram illustrating an exemplary electron beam tool, consistent with embodiments of the present disclosure that can be a part of the exemplary element beam inspection system of FIG. 1.

When modulator 800 is placed after sample 530, an existing structure of an electron beam tool can be used, while a detector can be simplified. For example, FIG. 12 illustrates an electron beam tool 104C comprising modulator 800. Modulator 800 may be positioned before or after secondary optical system 242. Modulator 800 may be configured to receive secondary beamlets 236, 238, and 240 having been emitted from the surface of wafer 230. Modulator 800 may output modulated beamlets that travel to a detector 244C.

Figure 13:
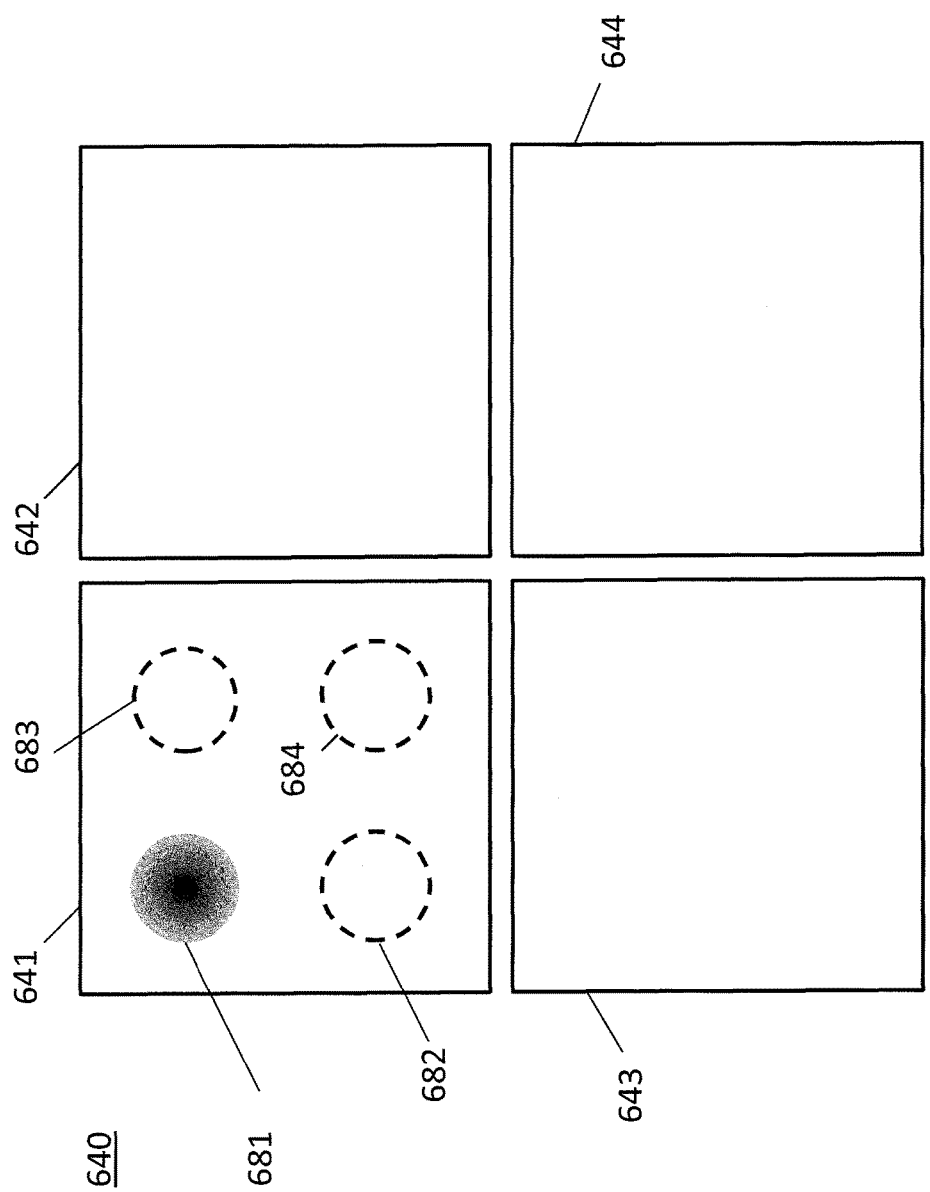
FIG. 13 is a diagram illustrating an exemplary surface of a detector, consistent with embodiments of the present disclosure.

In some embodiments, a detector can be configured to have a number of sensing elements greater than one. For example, FIG. 13 illustrates a detector 640 comprising four sensing elements 641, 642, 643, and 644. Each of the sensing elements may be sized such that one sensing element can receive one or more beam spots. As shown in FIG. 13, by way of example, a beam spot 681 may impinge on the surface of sensing element 641. Beam spot 681 may correspond to a beamlet, such as secondary beamlet 236. Other beam spots 682, 683, 684 may correspond to beamlets that are modulated together with beamlet 236 in one modulation group. For example, beamlets in one modulation group may be modulated so that when one beamlet is in an "on" state, all other beamlets in the modulation group are in an "off" state. Because the beamlets are modulated, only one beam spot may land on one sensing element at a time. Since a relatively wide area is provided for a plurality of beam spots, secondary optics can be configured to align beams within a larger target area. In some embodiments, for example, one or more of the plurality of beamlets may be configured to impinge roughly at the same location corresponding to one sensing element. Thus, beamlets may be configured to partially or fully spatially overlap on the detector surface. Furthermore, secondary optics need not necessarily be rigorously controlled to ensure that beamlets are aligned and focused on a respective target sensing element. Furthermore, the number of output current signal channels from detector 640 can be reduced.

At one extreme, a single sensing element can be provided in a detector so that a plurality of modulated beamlets can interact with the single sensing element. In comparison to this, some number of sensing elements can be provided in a detector array so that one or more modulated beamlets interact with respective sensing elements. A system can be optimized based on the number of output channels and bandwidth allocated to respective beamlets.

Interpretation of an output signal channel from a detector may comprise performing demodulation. Demodulation may be carried out internally or externally to the detector. Demodulation processing may occur at various locations based on availability of computing resources, for example. Modulator 800 may generate a plurality of PN codes corresponding to the plurality of modulated beams.

Figure 14:
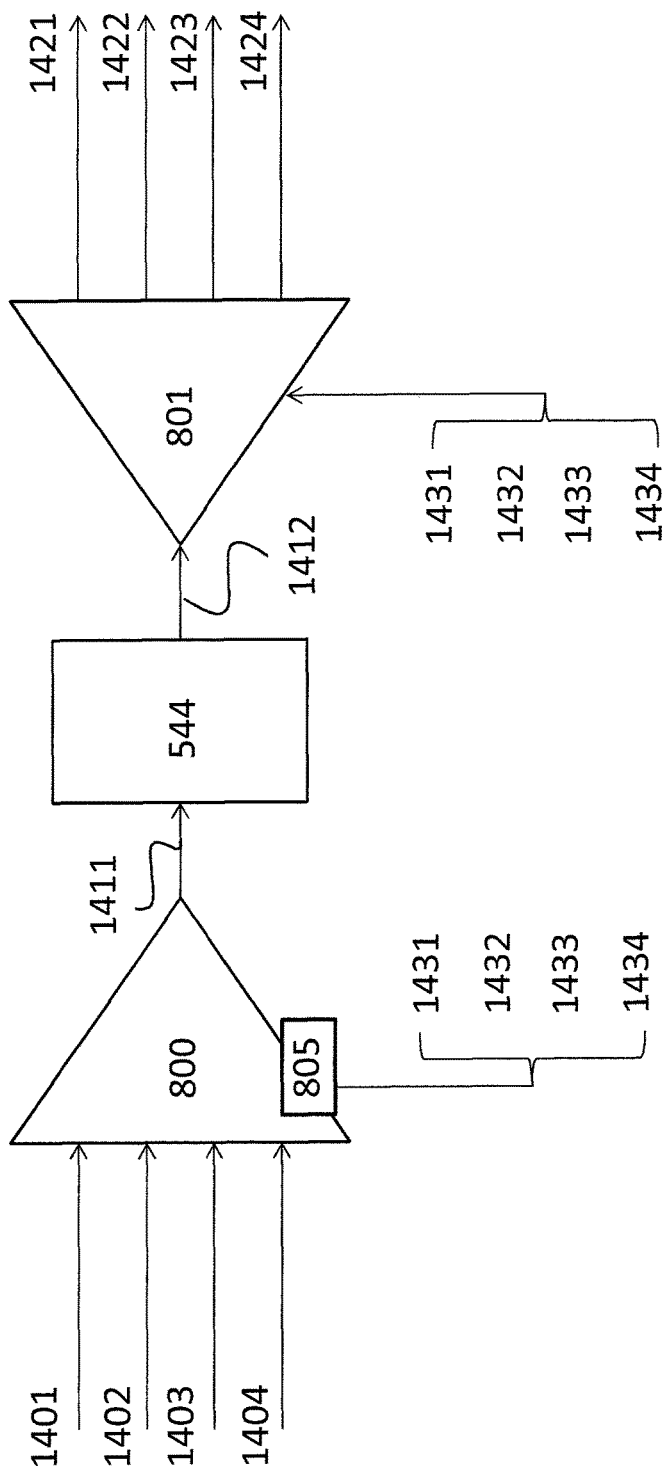
FIG. 14 is a diagram illustrating an exemplary modulation and demodulation scheme, consistent with embodiments of the present disclosure.

FIG. 14 is a schematic representation of modulation and demodulation. Modulation and demodulation may be performed analogous to a CDMA method. Modulator 800 may be configured to receive a plurality of charged particle beams 1401, 1402, 1403, and 1404. Modulator 800 may be configured to modulate the plurality of charged particle beams 1401, 1402, 1403, 1404 and to generate a modulated charged particle beam 1411. Modulated charged particle beam 1411 may be incident on a detector 544. Detector 544 may be configured to output a detected current signal 1412 based on the current generated as a result of modulated charged particle beam 1411 impinging on detector 544. For example, detector 544 may comprise a diode. Detected current signal 1412 may be encoded due to the modulation. Therefore, to extract signals of individual beamlets corresponding to different scanned data of a sample, a demodulator 801 may perform de-multiplexing. For example, modulator 800 may generate a plurality of PN codes 1431, 1432, 1433, 1434 corresponding to the plurality of charged particle beams 1401, 1402, 1403, 1404, respectively. The PN codes may be based on a series of pseudo-random numbers. A code generator 805 may be configured to generate the PN codes. Demodulator 801 may use PN codes 1431, 1432, 1433, 1434 to extract current signals 1421, 1422, 1423, and 1424 corresponding to the original charged particle beams 1401, 1402, 1403, and 1404. De-multiplexing may comprise performing an XOR operation with detected current signal 1412 and each of the PN codes 1431, 1432, 1433, and 1434. Demodulator 801 may comprise circuitry assisting with the demodulation for example, such as circuitry incorporating firmware. Alternatively, demodulator 801 may comprise one or more circuits integrated with detector 544. For example, demodulator 801 may be provided integrally with detector as 244B as shown in FIG. 11. Demodulator 801 may be part of a wiring layer included in detector 244B. Demodulator 801 may comprise a transceiver configured to communicate with code generator 805, a memory, and other circuity, for example.

Demodulator 801 may comprise a receiver configured to receive signals corresponding to a plurality of modulated charged particle beams. For example, a receiver of demodulator 801 may be configured to receive pin-diode current from a detector. Demodulator 801 may be configured to implement demodulation to interpret signals received from an output channel of a detector that receives modulated charged particle beams. Demodulator 801 may be loaded with firmware providing a modulation and/or demodulation scheme.

Detected current signal 1412 may be a single carrier line that conveys information associated with a plurality of beamlets. When charged particle beams are modulated, information of a plurality of different regions can be transmitted in a carrier line at once. For example, modulated charged particle beam 1411 may be a single carrier line that comprises a plurality of modulated beamlets representing different regions of a sample. After a detector detects current signals from the received modulated charged particle beam 1411, the current signals can be de-multiplexed to reconstruct original data representing the different regions.

In the scheme of FIG. 14, modulated charged particle beam 1411 may be represented as a single line; however, based on a construction of modulator 800, a charged particle beam may be emitted at separate locations. For example, modulator 800 may be configured to emit a plurality of beams according to a coding signal so that only one beam is emitted at a time. In some embodiments, for example, a plurality of modulation groups are provided so that a plurality of beams may be emitted at a time, each of the beams being directed to a different sensing element on detector 544.

Figure 15:
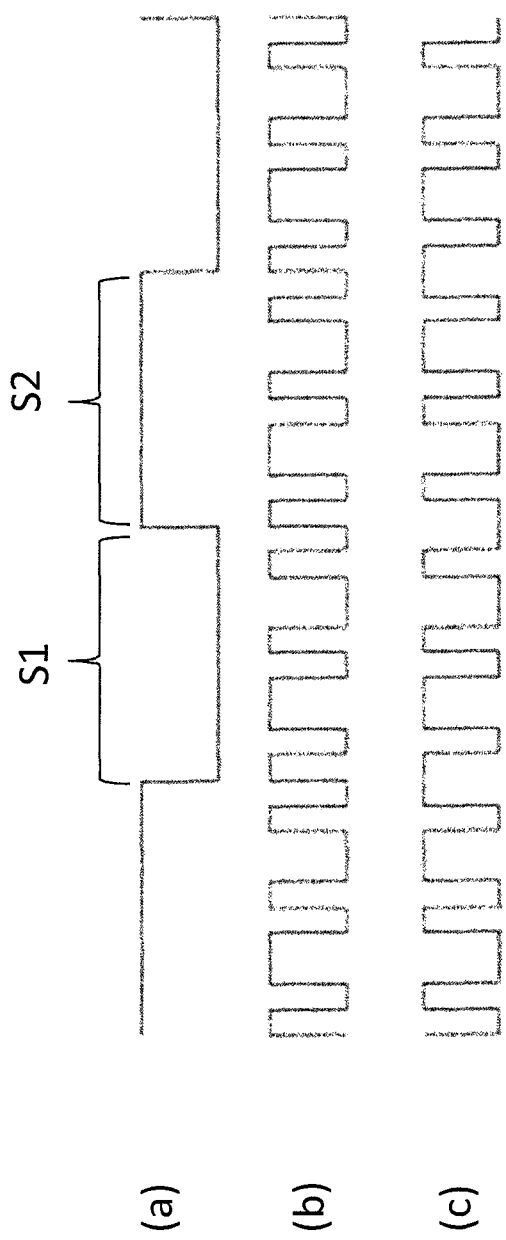
FIG. 15 is a diagram illustrating exemplary waveforms representing beam modulation, consistent with embodiments of the present disclosure.

With reference to FIG. 15, where the horizontal axis represents time and the vertical axis represents intensity in arbitrary units (AU), a graph (a) shows an exemplary detector signal for a corresponding beam impinging on a sensing element. A region S1 may represent a time where the sensing element is not receiving any charged particles, and thus, does not generate any current. A region S2 may represent a time where the sensing element is receiving charged particles on a surface thereof, and thus, a detection current signal is generated. The detection current signal may be a PIN diode current. A charged particle system may be configured to scan a beam across the surface of a sample such that detection current signals generated based on the charged particle beam's interactions with the sample may be indicative of the surface topology. In this manner, imaging of the sample surface based on the detection signal can be carried out.

In FIG. 15, a graph (b) shows an exemplary PN code. The PN code may be generated by code generator 805 of modulator 800. In FIG. 15, a graph (c) shows a modulated signal. The modulated signal may comprise a detector signal that is combined by bitwise XOR with a respective PN code. For example, graph (a) and graph (b) of FIG. 15 may be XORed to yield graph (c).

When modulator 800 is located between a sample and detector, modulation may be carried out according to FIG. 15. For example, a charged particle system may be configured to scan a beam over a sample surface. After interacting with a sample, a beam may be directed to modulator 800. If the beam were to travel directly to the detector, the beam may impinge on a sensing element and generate a detection signal such as that of graph (a). However, modulator 800 may receive the beam before the beam reaches the detector, and may generate a PN code such as that of graph (b). Modulator 800 may then modulate the beam so that the beam is output from modulator 800 in the manner represented by graph (c). Therefore, an actual detection signal generated by a sensing element receiving the modulated beam may correspond to graph (c).

A plurality of beams can be modulated together in one modulation group according to FIG. 15. For example, a plurality of PN codes can be generated such that their respective duty cycles do not temporally overlap with one another. Thus, the modulated beams directed to a sensing element of a detector may be configured to impinge on the sensing element at different times. The plurality of PN codes may be grouped according to an assignment of a predetermined number of beamlets to be directed to one sensing element of the detector. Meanwhile, in some embodiments, duty cycles for beams associated with codes of different groups may overlap.

Grouping of beams among a plurality of beams may be based on various criteria. For example, a modulation group may be set so that beams emitted from aperture 520 that are adjacent to one another are grouped together. In some embodiments, a beam emitted from one aperture hole may be grouped with beams emitted from directly adjacent aperture holes. In this manner, beams in close proximity may be directed to the same sensing element on a detector.

Figure 16:
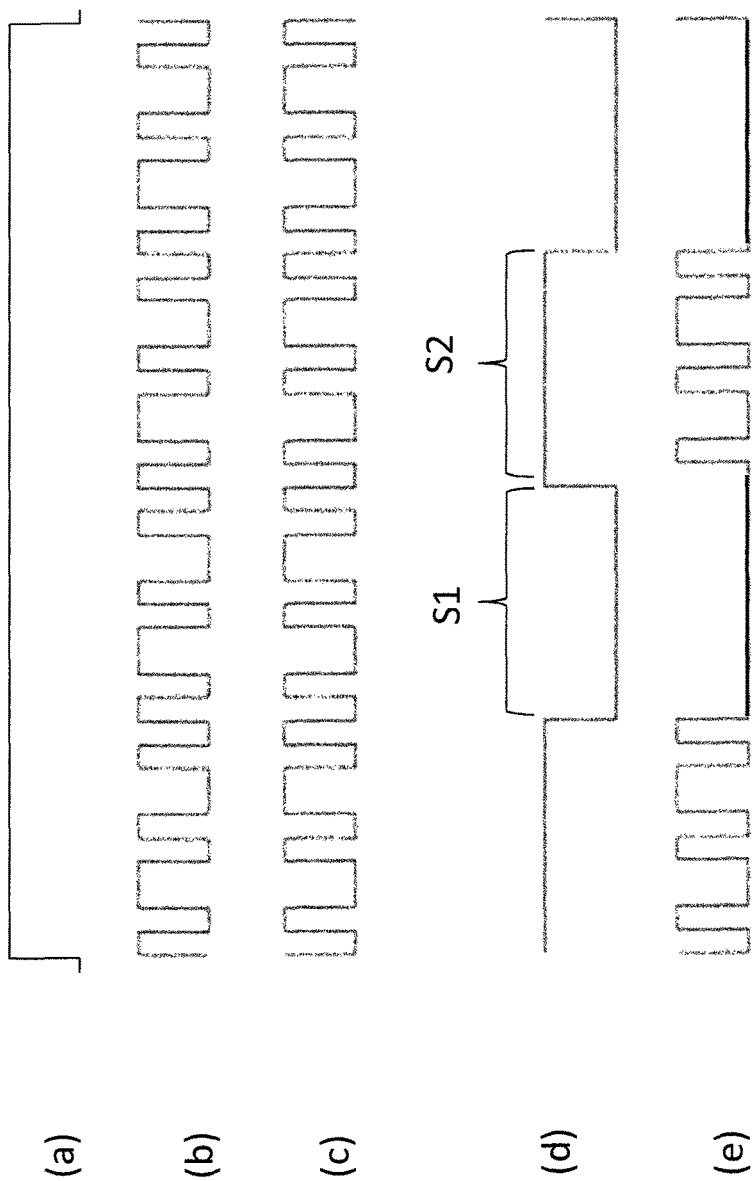
FIG. 16 is a diagram illustrating exemplary waveforms representing beam modulation, consistent with embodiments of the present disclosure.

With reference to FIG. 16, where the horizontal axis represents time and the vertical axis represents intensity in arbitrary units (AU), a graph (a) represents an exemplary charged particle beam. The charged particle beam may be a beamlet having a duty cycle of 1. Modulator 800 may generate a PN signal as shown in graph (b). Modulator 800 may then modulate the beam so that the beam is output from modulator 800 in the manner represented by graph (c). The modulated beam may comprise a signal that is combined by bitwise XOR with the PN code, yielding a beam as represented by graph (c).

In FIG. 16, graph (d) shows an exemplary detector signal for an unmodulated beam that would impinge on a sensing element after interacting with a sample. A region S1 may represent a time where the sensing element is not receiving any charged particles due to the sample surface topology, and thus, does not generate any current. A region S2 may represent a time where the sensing element is receiving charged particles on a surface thereof, and thus, a detection current signal is generated. In some embodiments, a charged particle system may be configured to scan a modulated beam, such as that represented by graph (c) of FIG. 16, across the surface of the sample. Due to the sample surface topology, an actual detection signal generated by a sensing element receiving the modulated beam may correspond to graph (e).

While the above examples show beam current signals detected by a sensing element represented as either on or off, it is understood that intermediate levels of signals may be generated, for example, when varying amounts of charged particles impinge on detector sensing elements.

While a PN code has been discussed, other modulation and demodulation techniques may be used that involve other codes as well. For example, modulation may comprise using other codes such as those applicable to telecommunications CDMA methods, such as a Gold code, Kasami code, maximum length sequence, Walsh Hadamard sequence, and the like. Furthermore, other types of modulation schemes, such as using orthogonal coding, can be employed.

In some embodiments, a plurality of sensing elements may be provided in a detector. A charged particle imaging system may comprise a charged particle source configured to generate a first number of beamlets. A number of the plurality of sensing elements of the detector may be a second number. The first number may be greater than the second number. For example, the first number may be in a range between, for example, 9 to 441. The second number may be in a range between, for example, 4 to 400. Modulation may be applied to modulate the beamlets in groups of a third number. The detector may be configured to generate output signals in a fourth number of channels. The third number and the fourth number may be equal.

In an exemplary system, a charged particle apparatus may be configured to generate 400 beamlets. Assuming one channel having a bandwidth of 50 MHz, information content to be transmitted by a detector may be 400×50 MHz. A detector comprising a 5×5 array of sensing elements may be provided. That is, 25 sensing elements are provided. The beamlets may be modulated in groups of 16, using 16 PN codes, for example. Thus, a modulator may be configured to modulate 16 beamlets together such that one sensing element receives one of the 16 beamlets at one time. That is, the modulated beamlets in one group do not temporally overlap on one sensing element. One sensing element can thus process 16 beam signals, and is able to output information from all of the 16 beam signals. Each of the 25 sensing elements may have an output channel having a bandwidth of 800 MHz. Therefore, a 5×5 detector array (comprising 25 sensing elements) can process the 400 beamlets generated by the charged particle apparatus. In a comparative example, a detector having 400 (or more) sensing elements may be configured to transmit 400 signals corresponding to each of the 400 beamlets. The detector having 25 sensing elements can transmit the same amount of information content as that of the detector having 400 sensing elements.

In other embodiments, a system can be configured with an intermediate number of codes and beams. For example, a modulator can be configured to generate 10 codes. Thus, 10 beamlets may be directed to a single sensing element of a detector. The detector may be an array comprising a plurality of sensing elements, each configured to receive a plurality of modulated beamlets. In some embodiments, when modulation is employed, a simplified detector can be achieved having high bandwidth.

Furthermore, a modulator may comprise a number of deflector elements greater than or equal to the number of beamlets to be generated. Thus, a system has a high degree of flexibility to accommodate various arrangements of charged beam system imaging. Additionally, a standardized component constituting a modulator can be provided to a variety of charged particle systems. For example, a modulator having an array of a first number of deflector elements can be provided to multi-beam charged particle systems configured to generate a second number of beamlets, where the first number is greater than the second number. The modulator may be configured to generate a corresponding number of codes based on the number of beamlets received. The modulator may comprise one or more sensors configured to determine a number of beamlets received. Thus, while some of the deflector elements may not actually receive any beams, the modulator can determine the number of deflector elements used out of the total number of deflector elements and generate a corresponding number of PN codes. The codes and corresponding modulation may be optimized to ensure advantageous duty cycles of the modulated beams. Optimization may be based on the number of deflector elements used. For example, the PN codes may be generated such that the period during which deflectors deflect beams away from the respective optical axis directions is minimized, thus allowing a greater amount of charged particles to ultimately reach the detector.

Modulation may be synchronized with beam scanning. For example, in an electron beam tool 104, all components may share basic clocks and timing. Thus, components in detector 244 can be synchronized with components of modulator 800, such as deflector 1010 and code generator 805. Therefore, data recording can be aligned with beam scanning. Furthermore, components in primary projection optical system 220, such as deflection scanning unit 226, can be synchronized with components of modulator 800, such as deflector 1010.

In a charged particle beam system for imaging, a charged particle beam may be generated and scanned across a sample surface with a predetermined frequency to obtain signals that represent features on the sample. For example, in some embodiments, a charged particle system may be configured to scan across the sample under conditions of: 100 ms scan at 100 MHz. Furthermore, a charged particle beam system may be configured so that there are approximately 8,000 pixels in a row, so that scan time for a line may be, for example, approximately 100 ms. Data content transmission may be configured so that its frequency is always lower than half the frequency of the scan rate. For example, in order to avoid aliasing, based on the Nyquist criteria, a charged particle beam system may be configured with a 100 MHz scan rate and signal bandwidth of less than 50 MHz. In some embodiments, for 8-bit ADC×n channels, an output rate of 1,000 MB/s with buffer size of 125 MB can be used. Thus, a frequency to be used for an imaging channel may be in a range of, for example, 1 to 100 MHz. In some embodiments, a frequency to be used for an imaging channel may be in a range of, for example, 20 to 50 MHz. In some embodiments, an imaging channel may use a frequency of 33 MHz. A detector comprising one or more sensing elements may be configured to transmit detector current using an imaging channel frequency.

For some charged particle beam systems, other scan frequencies larger than 100 MHz can be used. For example, a frequency of 400 MHz may be used.

In some embodiments, a modulator comprises a switchable deflector that is operable on the order of GHz. Meanwhile, an output channel from a detector sensing element may be on the order of MHz. Thus, switching between states of the deflector of the modulator may occur at a speed several orders of magnitude higher than a data transmission speed of the detector. Modulation can therefore occur at a speed several orders of magnitude higher than that of detector signal transmission.

Optimization of codes may also be based on frequencies of a detector output.

In some embodiments, a detector array can be simplified by reducing the number of sensing elements. A detector array can also be simplified by reducing the number of switches in a switching matrix that controls outputs of detector sensing elements.

In exemplary comparative detector systems, a detector may be limited by the amount of charged particle current it is able to detect. For example, a detection branch may be responsible for a reduction in the amount of charged particle current detected such that approximately one half of the current admitted into the column is eventually output as a detection signal. Thus, capture efficiency is ½. In some exemplary embodiments of the present disclosure, modulation may be responsible for a reduction of some amount of current, since charged particle beams may be deflected onto an aperture surface when a deflector is operating in the "off" state. Some exemplary embodiments using modulation may achieve capture efficiency of greater than ½, for example.

In some embodiments, a detector may communicate with a controller that controls a charged particle beam system. For example, the detector may transmit beam current output to the controller, and the controller may control various functions of the charged particle beam system in response. Furthermore, the controller may communicate with a modulator to transmit codes, such as PN codes. Exemplary forms of communication may be through a medium such as an electrical conductor, optical fiber cable, portable storage media, IR, Bluetooth, internet, wireless network, wireless radio, or a combination thereof. The controller may receive a signal from the detector and may construct an image. A controller may also perform various post-processing functions, such as demodulation, image subdivision, generating contours, superimposing indicators on an acquired image, and the like. The controller may comprise a storage that is a storage medium such as a hard disk, random access memory (RAM), other types of computer readable memory, and the like. The storage may be used for saving scanned raw image data as original images, and post-processed images.

While a controller, storage, and one or more circuits are discussed above as separate units, a computer may carry out the processing of all such units.

A non-transitory computer readable medium may be provided that stores instructions for a processor of controller 109 to carry out modulation, demodulation, and/or image processing. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

It will be appreciated that the present invention is not limited to the exact construction that has been described above and illustrated in the accompanying drawings, and that various modifications and changes can be made without departing from the scope thereof.

To expedite the foregoing portion of the disclosure, various combinations of elements are described together. It is to be understood that aspects of the disclosure in their broadest sense are not limited to the particular combinations previously described. Rather, embodiments of the invention, consistent with this disclosure, and as illustrated by way of example in the figures, may include one or more of the following listed features, either alone or in combination with any one or more of the following listed features, or in combination with the previously described features.

For example, there may be provided a charged particle beam system. The charged particle beam system may include a charged particle source configured to generate a plurality of charged particle beams; a modulator configured to receive the plurality of charged particle beams and generate a plurality of modulated charged particle beams; and a detector configured to receive the plurality of modulated charged particle beams. There may also be provided:

- wherein the charged particle source is configured to generate a first number of the plurality of charged particle beams.
- wherein the detector comprises a second number of sensing elements, the second number being less than the first number.
- wherein the second number is one.
- a code generator configured to generate a plurality of codes corresponding to the plurality of charged particle beams.
- wherein the modulator is configured to modulate the plurality of charged particle beams based on the plurality of codes.
- wherein the modulator is configured to modulate a group of the plurality of charged particle beams, the group comprising a third number of the plurality of charged particle beams, the third number being less than the first number.
- wherein the modulator is configured to emit grouped modulated charged particle beams of the group of the plurality of charged particle beams onto a sensing element of the sensing elements.
- wherein the grouped modulated charged particle beams of the group do not temporally overlap one another on the sensing element.
- wherein the codes are configured so that a modulated charged particle beam of the plurality of modulated charged particle beams does not temporally overlap with another modulated charged particle beam of the plurality of modulated charged particle beams on the detector.
- a controller.
- wherein the controller is configured to demodulate the plurality of modulated charged particle beams.
- one or more circuits integrated with the detector.

wherein the one or more circuits are configured to demodulate the plurality of modulated charged particle beams.

wherein the plurality of modulated charged particle beams are demodulated based on the plurality of codes.

wherein the modulator comprises one or more deflectors configured to deflect one or more of the plurality of charged particle beams to generate the plurality of modulated charged particle beams.

wherein the plurality of charged particle beams comprise a plurality of beamlets generated based on a primary charged particle beam emitted from the charged particle source.

There may be provided, for example, a method for modulating a charged particle beam. The method may include generating a plurality of modulated charged particle beams based on a plurality of charged particle beams generated by a charged particle source; and detecting the plurality of modulated charged particle beams. There may also be provided:

generating a first number of the plurality of charged particle beams.

detecting the plurality of modulated charged particle beams by a second number of sensing elements of a detector, the second number being less than the first number.

generating a plurality of codes corresponding to the plurality of charged particle beams.

modulating the plurality of charged particle beams based on the plurality of codes.

grouping the plurality of charged particle beams in one or more groups, a group of the one or more groups comprising a third number of the plurality of charged particle beams, the third number being less than the first number.

emitting grouped modulated charged particle beams of the group of the plurality of charged particle beams onto a sensing element of the sensing elements so that the grouped modulated charged particles beams of the group do not temporally overlap one another on the sensing element.

wherein the codes are configured so that a modulated charged particle beam of the plurality of modulated charged particle beams does not temporally overlap with another modulated charged particle beam of the plurality of modulated charged particle beams on the detector.

demodulating the plurality of modulated charged particle beams.

acquiring an image of a sample based on a demodulated signal of the plurality of modulated charged particle beams.

wherein the plurality of modulated charged particle beams are received from the sample.

wherein the plurality of modulated charged particle beams are demodulated based on the plurality of codes.

wherein the plurality of modulated charged particle beams are generated by switching a modulator between an on state and an off state.

There may be provided, for example, a non-transitory computer readable medium comprising a set of instructions that are executable by one or more processors of an apparatus to cause the apparatus to perform a computer-implemented method. The computer-implemented method may include driving a modulator to generate a plurality of modulated charged particle beams using a plurality of modulation codes, the plurality of modulated charged particle beams based on a plurality of charged particle beams generated from a charged particle source. There may also be provided:

detecting the plurality of modulated charged particle beams.

generating a first number of the plurality of charged particle beams.

detecting the plurality of modulated charged particle beams by a second number of sensing elements of a detector, the second number being less than the first number.

generating the plurality of modulation codes corresponding to the plurality of charged particle beams.

modulating the plurality of charged particle beams based on the plurality of modulation codes.

grouping the plurality of charged particle beams in one or more groups, a group of the one or more groups comprising a third number of the plurality of charged particle beams, the third number being less than the first number.

emitting grouped modulated charged particle beams of the group of the plurality of charged particle beams onto a sensing element of the sensing elements so that the grouped modulated charged particles beams of the group do not temporally overlap one another on the sensing element.

wherein a modulated charged particle beam of the plurality of modulated charged particle beams does not temporally overlap with another modulated charged particle beam of the plurality of modulated charged particle beams on the detector.

demodulating the plurality of modulated charged particle beams.

acquiring an image of a sample based on a demodulated signal of the plurality of modulated charged particle beams.

wherein the plurality of modulated charged particle beams are received from the sample.

wherein the plurality of modulated charged particle beams are demodulated based on the plurality of modulation codes.

wherein the plurality of modulated charged particle beams are generated by switching a modulator between an on state and an off state.

There may be provided, for example, a modulator. The modulator may include a first aperture comprising a first aperture hole; a code generator configured to generate a modulation code; a deflector configured to direct a charged particle beam received in the modulator onto a surface of the first aperture according to the modulation code. There may also be provided:

wherein the deflector is operable between two states.

wherein in one state, the charged particle beam is directed through the first aperture hole, and in the other state, the charged particle beam is directed onto the surface of the first aperture.

wherein the code generator is configured to generate a plurality of pseudo-random number codes as the modulation code.

There may be provided, for example, a demodulator. The demodulator may include a receiver configured to receive signals corresponding to a plurality of modulated charged particle beams; and circuitry configured to demodulate the signals of the plurality of modulated charged particle beams based on modulation codes. There may also be provided:

wherein the plurality of modulated charged particle beams do not temporally overlap on the detector.

a transceiver configured to receive the modulation codes from a code generator.
wherein the demodulator is integral with a detector that provides the signals.
wherein the demodulator is part of a controller of a charged particle beam system.

What is claimed is:

1. A charged particle beam system comprising:
a charged particle source configured to generate a plurality of charged particle beams;
a modulator configured to receive the plurality of charged particle beams and generate a plurality of modulated charged particle beams, wherein the plurality of modulated charged particle beams are generated by switching between an on state and an off state; and
a detector configured to receive the plurality of modulated charged particle beams.

2. The system of claim 1, wherein
the charged particle source is configured to generate a first number of the plurality of charged particle beams, and
the detector comprises a second number of sensing elements, the second number being less than the first number.

3. The system of claim 2, wherein the second number is one.

4. The system of claim 1, further comprising
a code generator configured to generate a plurality of codes corresponding to the plurality of charged particle beams,
wherein the modulator is configured to modulate the plurality of charged particle beams based on the plurality of codes.

5. The system of claim 2, wherein
the modulator is configured to modulate a group of the plurality of charged particle beams, the group comprising a third number of the plurality of charged particle beams, the third number being less than the first number,
the modulator is configured to emit grouped modulated charged particle beams of the group of the plurality of charged particle beams onto a sensing element of the sensing elements, wherein the grouped modulated charged particle beams of the group do not temporally overlap one another on the sensing element.

6. The system of claim 1, further comprising
at least one of: a controller and one or more circuits integrated with the detector,
wherein the at least one of the controller and the one or more circuits is configured to demodulate the plurality of modulated charged particle beams.

7. The system of claim 1, wherein the modulator comprises one or more deflectors configured to deflect one or more of the plurality of charged particle beams to generate the plurality of modulated charged particle beams.

8. The system of claim 1, wherein the plurality of modulated charged particle beams are generated by a deflector switching between the on state and the off state.

9. The system of claim 1, wherein the plurality of modulated charged particle beams are generated by a switch or a shutter switching between the on state and the off state.

10. A method comprising:
generating a plurality of modulated charged particle beams based on a plurality of charged particle beams generated by a charged particle source, wherein the plurality of modulated charged particle beams are generated by switching between an on state and an off state; and
detecting the plurality of modulated charged particle beams.

11. The method of claim 10, further comprising
generating a first number of the plurality of charged particle beams, and
detecting the plurality of modulated charged particle beams by a second number of sensing elements of a detector, the second number being less than the first number.

12. The method of claim 10, further comprising
generating a plurality of codes corresponding to the plurality of charged particle beams; and
modulating the plurality of charged particle beams based on the plurality of codes.

13. The method of claim 11, further comprising
grouping the plurality of charged particle beams in one or more groups, a group of the one or more groups comprising a third number of the plurality of charged particle beams, the third number being less than the first number,
emitting grouped modulated charged particle beams of the group of the plurality of charged particle beams onto a sensing element of the sensing elements so that the grouped modulated charged particles beams of the group do not temporally overlap one another on the sensing element.

14. The method of claim 10, further comprising
demodulating the plurality of modulated charged particle beams.

15. The method of claim 14, further comprising
acquiring an image of a sample based on a demodulated signal of the plurality of modulated charged particle beams,
wherein the plurality of modulated charged particle beams are received from the sample.

16. A non-transitory computer readable medium comprising a set of instructions that are executable by one or more processors of an apparatus to cause the apparatus to perform a method comprising:
driving a modulator to generate a plurality of modulated charged particle beams using a plurality of modulation codes, wherein the plurality of modulated charged particle beams are generated by switching between an on state and an off state to affect a plurality of charged particle beams generated from a charged particle source.

17. The computer readable medium of claim 16, wherein the set of instructions further cause the apparatus to perform:
generating a first number of the plurality of charged particle beams, and
detecting the plurality of modulated charged particle beams by a second number of sensing elements of a detector, the second number being less than the first number.

18. The computer readable medium of claim 17, wherein the set of instructions further cause the apparatus to perform:
grouping the plurality of charged particle beams in one or more groups, a group of the one or more groups comprising a third number of the plurality of charged particle beams, the third number being less than the first number,
emitting grouped modulated charged particle beams of the group of the plurality of charged particle beams onto a sensing element of the sensing elements so that the grouped modulated charged particles beams of the group do not temporally overlap one another on the sensing element.

19. The computer readable medium of claim 16, wherein the set of instructions further cause the apparatus to perform:
   generating the plurality of modulation codes corresponding to the plurality of charged particle beams; and
   modulating the plurality of charged particle beams based on the plurality of modulation codes.

20. The computer readable medium of claim 19, wherein the plurality of modulation codes are configured so that a modulated charged particle beam of the plurality of modulated charged particle beams does not temporally overlap with another modulated charged particle beam of the plurality of modulated charged particle beams on the detector.

21. The computer readable medium of claim 19, wherein the plurality of modulated charged particle beams are demodulated based on the plurality of modulation codes.

* * * * *